United States Patent [19]
Shizuki et al.

[11] Patent Number: 5,914,536
[45] Date of Patent: Jun. 22, 1999

[54] SEMICONDUCTOR DEVICE AND SOLDERING PORTION INSPECTING METHOD THEREFOR

[75] Inventors: Yasushi Shizuki, Ichikawa; Yuji Iseki, Yokohama; Naoko Ono, Tokyo; Kunio Yoshihara, Yokohama; Masayuki Saito, Yokohama; Hiroshi Yamada, Yokohama; Kazuki Tateyama, Yokohama, all of Japan

[73] Assignee: Kabushiki Kaisha Toshiba, Kawasaki, Japan

[21] Appl. No.: 08/678,536

[22] Filed: Jul. 5, 1996

[30] Foreign Application Priority Data

| Jul. 7, 1995 | [JP] | Japan | 7-171711 |
| Jun. 28, 1996 | [JP] | Japan | 8-170412 |

[51] Int. Cl.⁶ .................................................. H01L 23/48
[52] U.S. Cl. .......................... 257/778; 257/779; 257/780; 257/786
[58] Field of Search ..................................... 257/778, 779, 257/780, 786

[56] References Cited

U.S. PATENT DOCUMENTS

| 3,303,393 | 2/1967 | Hymes et al. . |
| 3,871,014 | 3/1975 | King et al. ............................ 257/779 |

FOREIGN PATENT DOCUMENTS

| 53-35382 | 4/1978 | Japan . |
| 59-129453 | 7/1984 | Japan .................................. 257/779 |
| 2-232947 | 9/1990 | Japan . |

OTHER PUBLICATIONS

L.F. Miller "Microelectronic Device Standoffs" IBM Technical Disclosure Bulletin vol. 8. No. 3 Aug. 1965.

*Primary Examiner*—Peter Toby Brown
*Assistant Examiner*—Roy Potter
*Attorney, Agent, or Firm*—Oblon, Spivak, McClelland, Maier & Neustadt, P.C.

[57] ABSTRACT

A semiconductor device includes a wiring board having a main surface and a plurality of pad electrodes formed on the main surface, a rectangular semiconductor element having a main surface facing the main surface of the wiring board and mounted on the main surface of the wiring board, a solder resist formed to surround the semiconductor element with a preset distance therefrom on the main surface of the wiring board, a plurality of terminal electrodes formed on the end portion of the main surface of the semiconductor element, and a plurality of solder bumps for electrically connecting the plurality of pad electrodes to the plurality of terminal electrodes with a gap provided between the main surface of the wiring board and the main surface of the semiconductor element, wherein each of the plurality of pad electrodes includes at least a portion which extends from substantially under a corresponding one of the plurality of terminal electrodes of the semiconductor element to the solder resist lying outside the semiconductor element and each of the plurality of solder bumps includes a portion extending over part of a corresponding one of the plurality of pads which lies outside the semiconductor element.

8 Claims, 11 Drawing Sheets

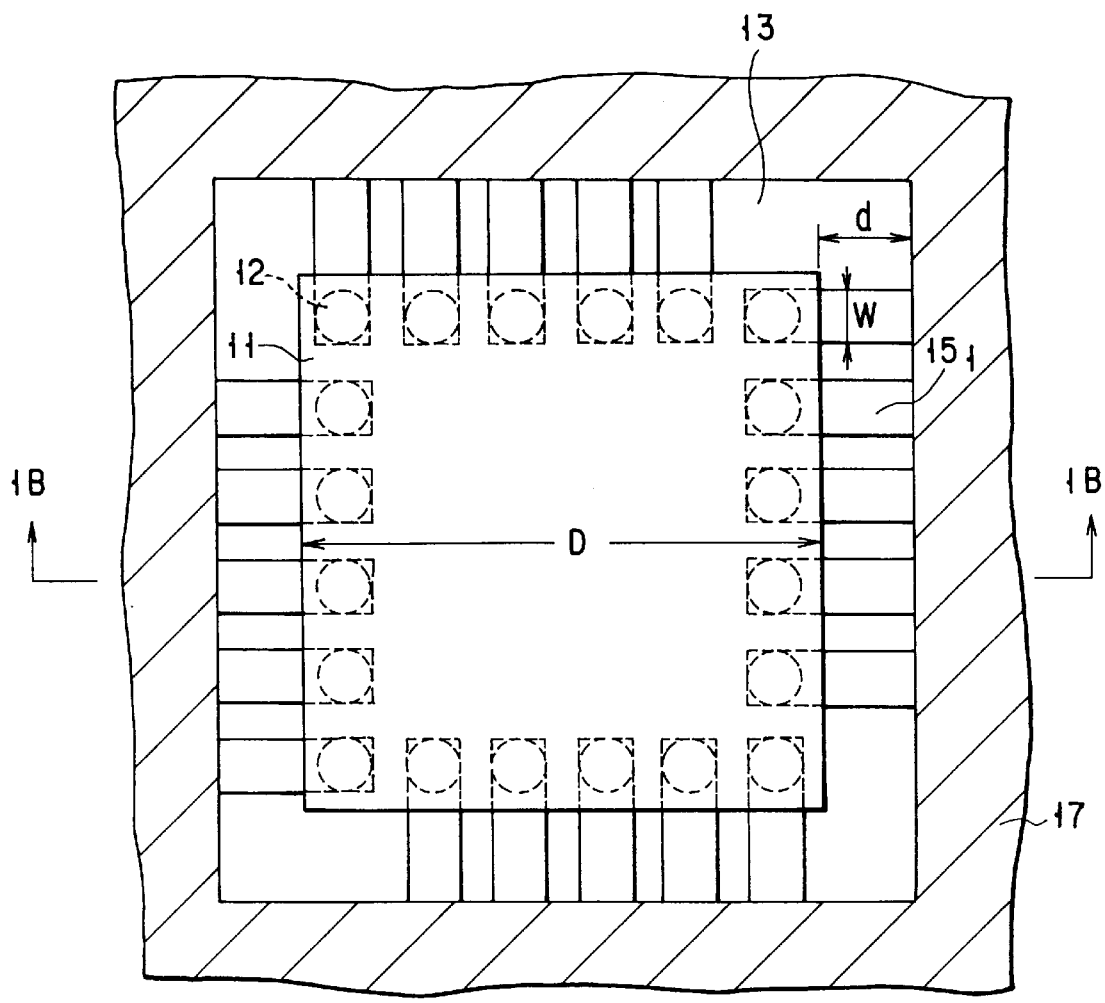
F I G. 1A
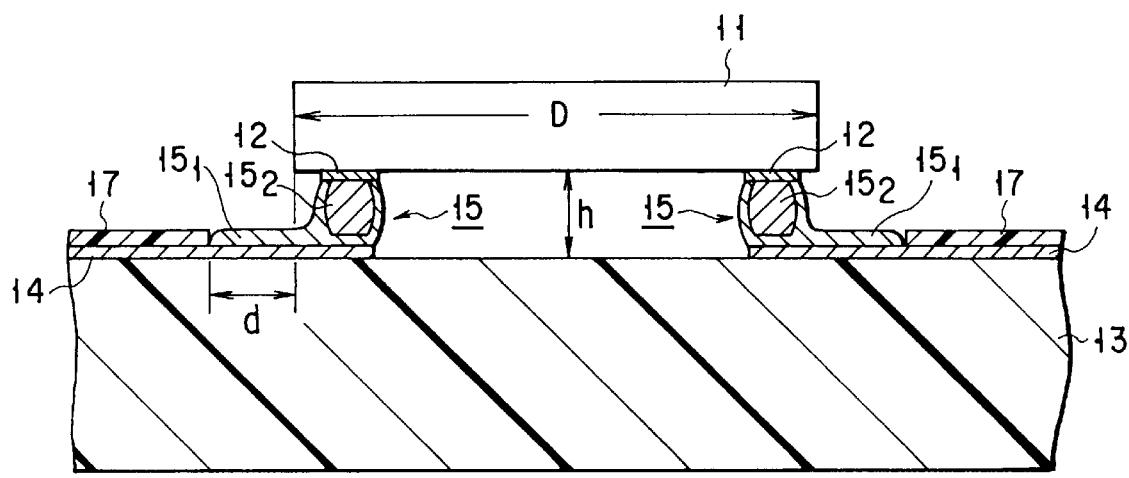
F I G. 1B

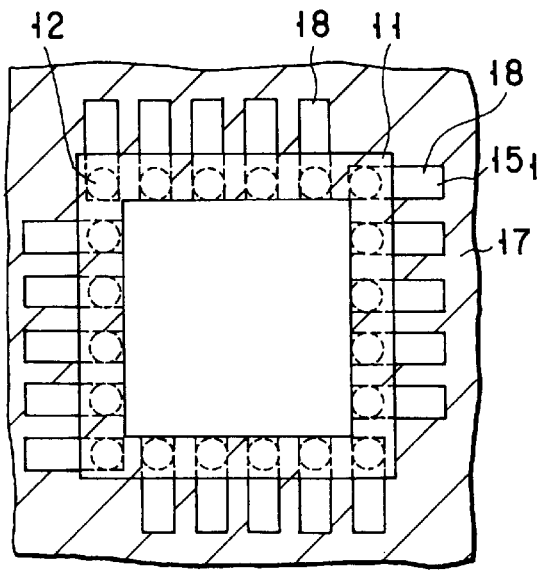
F I G. 5
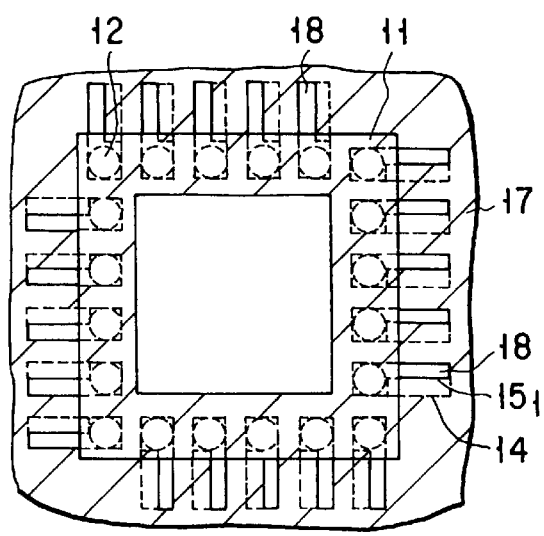
F I G. 6
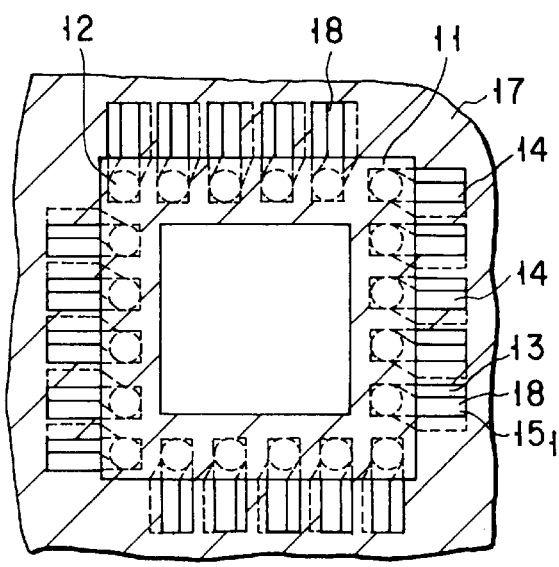
F I G. 7
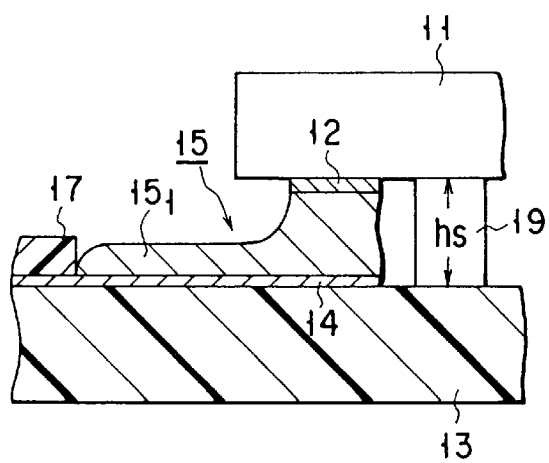
F I G. 8

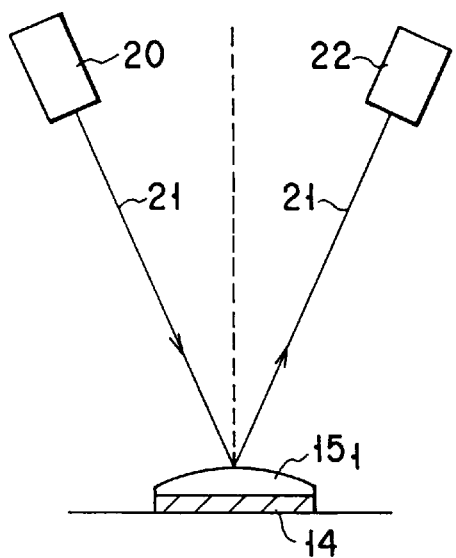
F I G. 9A
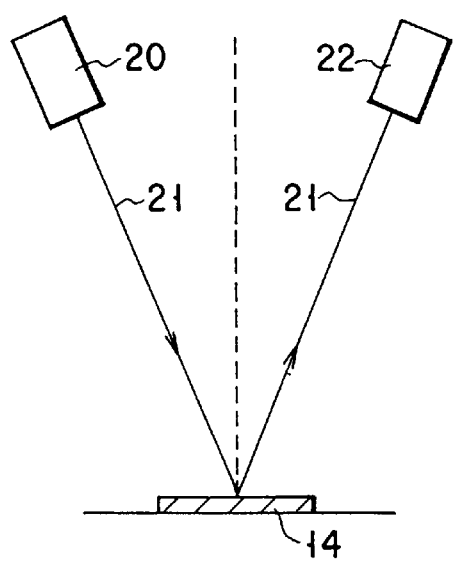
F I G. 9B
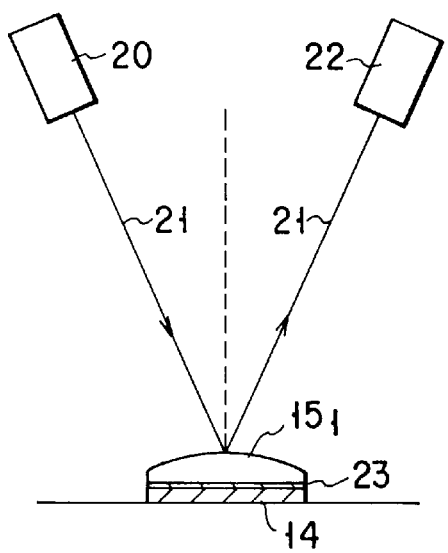
F I G. 10A
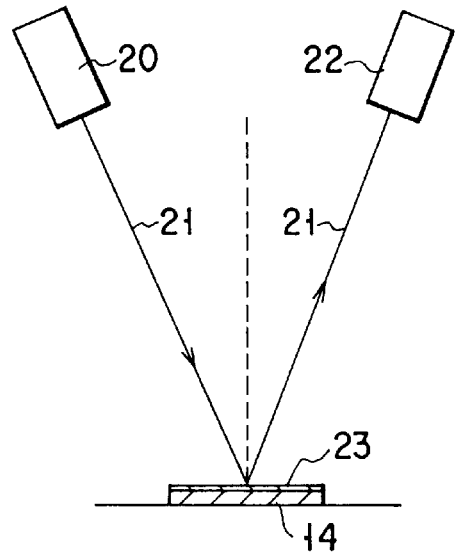
F I G. 10B

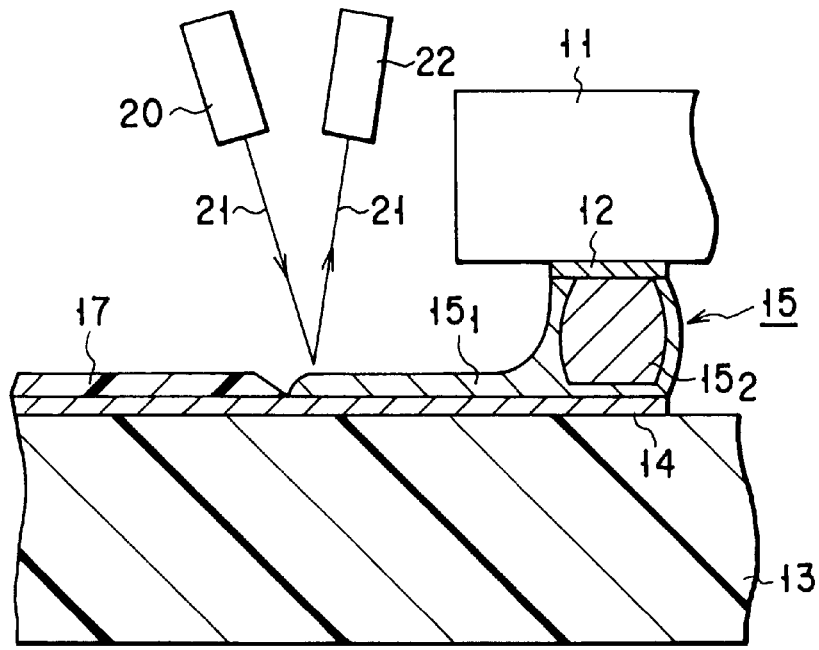
F I G. 11A
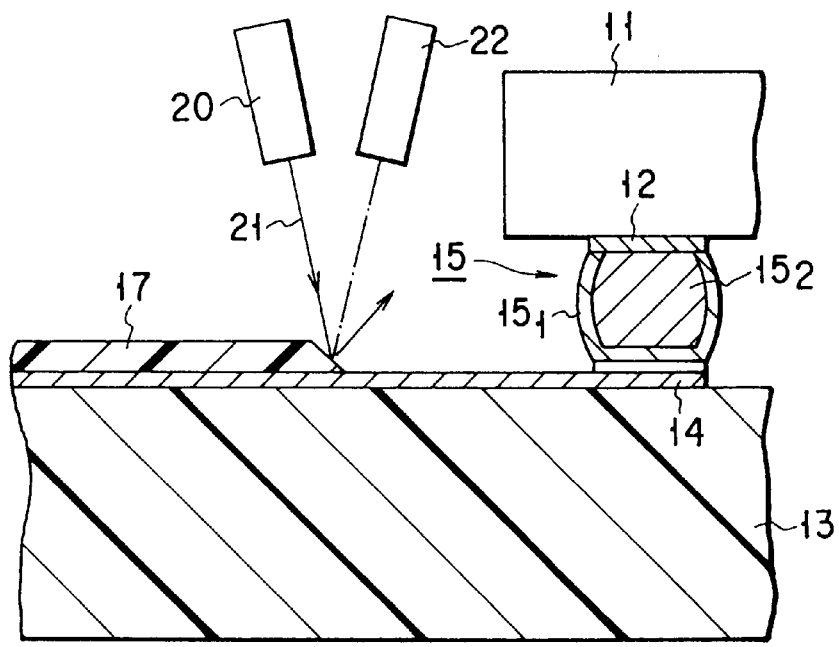
F I G. 11B

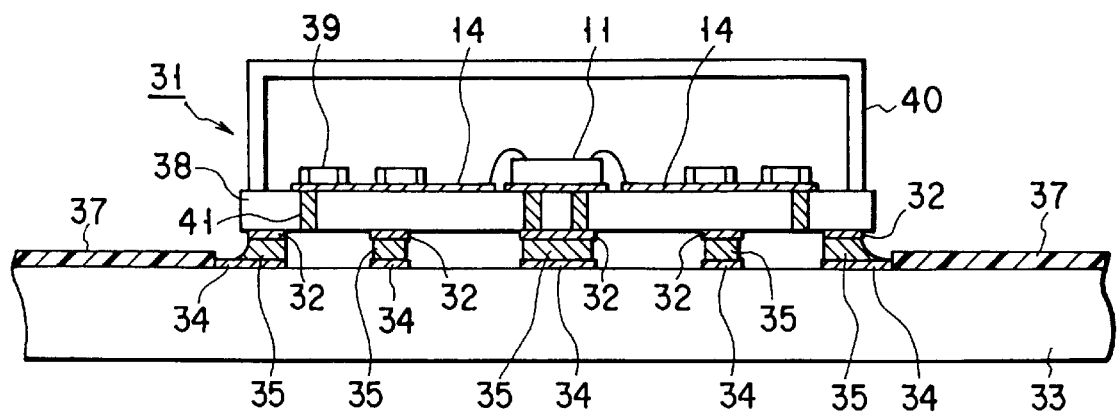
F I G. 12
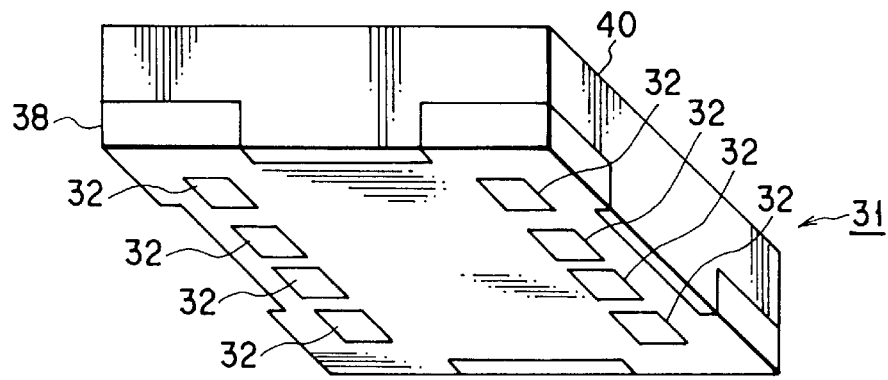
F I G. 13
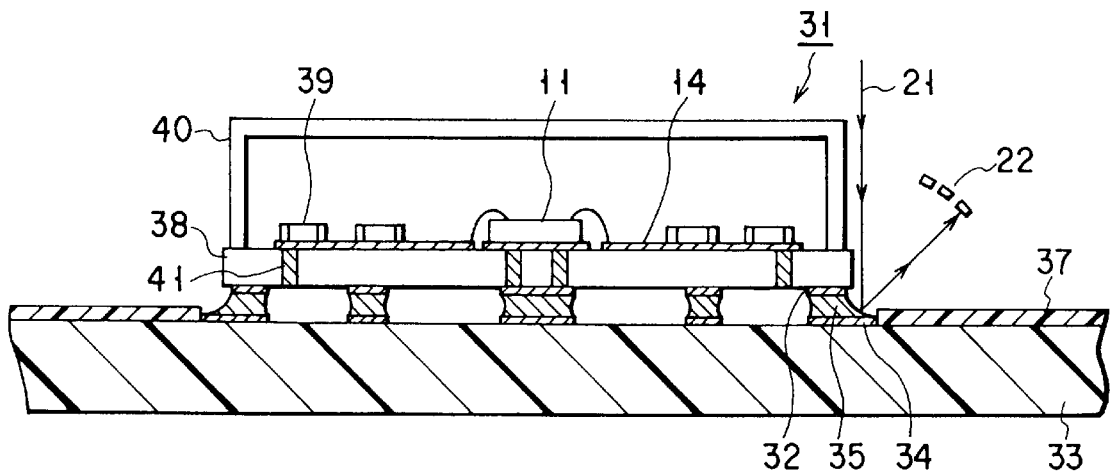
F I G. 14

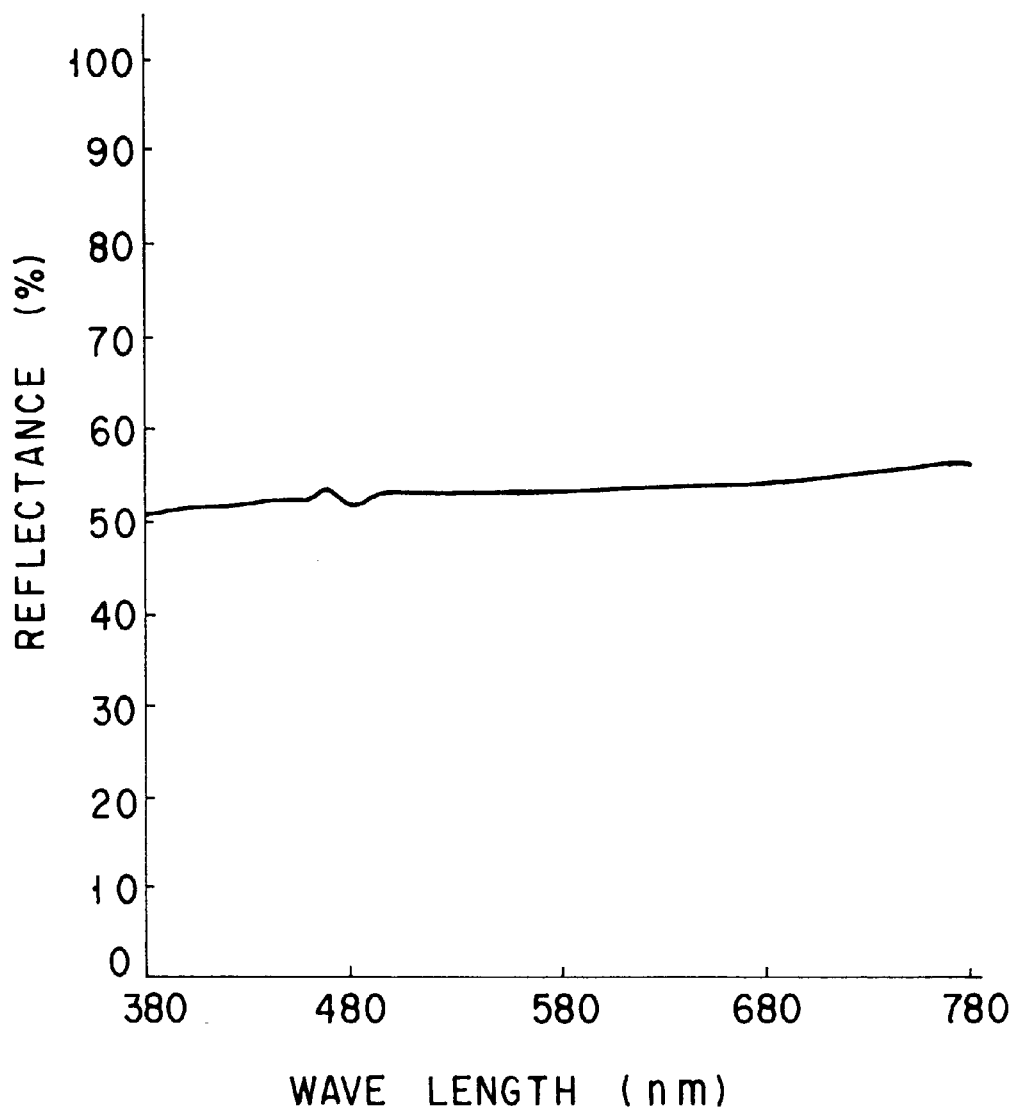
F I G. 25

SEMICONDUCTOR DEVICE AND SOLDERING PORTION INSPECTING METHOD THEREFOR

BACKGROUND OF THE INVENTION

1. Field of the Invention

This invention relates to a semiconductor device and more particularly to a semiconductor device having a semiconductor chip or a semiconductor module mounted on a substrate and a soldering portion inspecting method therefor.

2. Description of the Related Art

Recently, with the rapid development of electronics, electronic devices and semiconductor devices used therein are miniaturized. In order to miniaturize the semiconductor (assembling) devices, it is required to mount components such as semiconductor chips with a higher density. As one of the methods for satisfying the above requirements, a flip chip interconnection method is provided.

As is well known in the art, the flip chip interconnection method is the technique for forming solder bumps on the terminal electrodes of the semiconductor chip, aligning the bumps of the semiconductor chip with respective pad electrodes on a wiring board, and then connecting the terminal electrodes of the semiconductor chip to the respective pad electrodes on the wiring board by reflow. Since the terminal electrode of the semiconductor chip is formed on the semiconductor element forming surface and the semiconductor element forming surface is set to face the wiring board when the semiconductor chip is mounted on the wiring board, it is called "face-down bonding".

Since the flip chip interconnection method is to connect the terminal electrode of the semiconductor chip to the board via the solder bump, it is not necessary to provide a space for connection in the peripheral portion of the semiconductor chip unlike the wire bonding method and TAB (Tape Automated Bonding) method. Therefore, the high packing density of the semiconductor chip can be attained and the electrical characteristic can be enhanced because of the short wiring length.

However, since the connecting portion lies in a region below the semiconductor element when the semiconductor chip and the wiring board are connected by the flip chip interconnection method, it is impossible to inspect the connection by external observation. Therefore, defective connection (open, bridge or the like) between the semiconductor element and the wiring board cannot be detected until the operation test for the semiconductor element is effected, thereby causing the manufacturing yield of the semiconductor device to be lowered.

Therefore, a method for previously checking the amount of solder of the solder bump to make the connection quality uniform (U.S. Pat. No. 4,428,676) and a method for inspecting the bump by use of X ray are proposed. However, the former method does not directly inspect the connecting portion and the latter method requires a high equipment cost and is not adequate for 100% inspection.

For this reason, it is desired to develop a flip chip interconnection structure which can easily inspect the connecting portion and a method for inspecting the connecting portion.

SUMMARY OF THE INVENTION

An object of this invention is to provide a semiconductor device including a flip chip interconnection structure in which a connecting portion can be easily inspected and a soldering portion inspecting method therefor.

In order to attain the above object, a semiconductor device according to a first aspect of this invention comprises a wiring board having a main surface and a plurality of pad electrodes formed on the main surface; a rectangular semiconductor element having a main surface facing the main surface of the wiring board and mounted on the main surface of the wiring board; a solder resist formed to surround the semiconductor element with a preset distance therefrom on the main surface of the wiring board; a plurality of terminal electrodes formed on the end portion of the main surface of the semiconductor element; and a plurality of solder bumps for electrically connecting the plurality of pad electrodes to the plurality of terminal electrodes with a gap provided between the main surface of the wiring board and the main surface of the semiconductor element; wherein each of the plurality of pad electrodes includes at least a portion which extends from substantially under a corresponding one of the plurality of terminal electrodes of the semiconductor element to the solder resist lying outside the semiconductor element and each of the plurality of solder bumps includes a portion extending over part of a corresponding one of the plurality of pads which lies outside the semiconductor element.

If the preset distance between the semiconductor element and the solder resist is d, it is preferable to satisfy relation of $0.02 \text{ mm} \leq d \leq 1 \text{ mm}$.

Further, if the preset distance between the semiconductor element and the solder resist is d and the length of the long side of the semiconductor element is D, it is preferable to satisfy relation of $0.005 \leq d/D \leq 0.25$.

Further, if the preset distance between the semiconductor element and the solder resist is d and the width of the pad electrode along the side surface of the semiconductor element is W, it is preferable to satisfy relation of $d \leq W$.

The solder bump preferably contains a metal core connected to the terminal electrode.

The semiconductor element can be provided in the form of a semiconductor chip, a semiconductor module having a plurality of semiconductor chips set in one package, or a packaged semiconductor chip.

According to this invention, since the area of the solder spread from the solder bump formed on the peripheral portion of the semiconductor element onto the pad electrode is defined by the solder resist formed on the end portion of the pad electrode, the area of contact of the bump with the pad electrode (conductive wiring) can be made constant.

Further, since the solder is interrupted by the solder resist, it becomes possible to prevent adjacent bumps of adjacent semiconductor elements from being connected via the solder.

As a result, it becomes possible to provide a semiconductor device which is excellent in the reliability and in which the high packing density by the flip chip interconnection method can be attained.

Further, when the semiconductor device is viewed from above, the solder is formed outside the semiconductor element, that is, it is formed to extend out from the semiconductor element, the inspection of connection of the semiconductor device effected after connecting the bumps can be made easy.

A semiconductor element for a semiconductor device according to a second aspect of this invention comprises a rectangular substrate having a main surface and four sides; a plurality of rectangular terminal electrodes formed on the main surface along at least one of the four sides of the substrate and each having a first pair of sides parallel to the at least one side and a second pair of sides perpendicular to the first pair of sides, each of the plurality of terminal electrodes having a laminated structure of a first metal electrode formed on the substrate and a second metal electrode formed of a material which is not wet with solder and formed on the first metal electrode; rectangular parallelepiped metal cores respectively formed on the plurality of terminal electrodes, a bottom surface of each of the metal cores having short sides shorter than the first pair of sides of each of the plurality of terminal electrodes and long sides which are perpendicular to the short sides and are not longer than the second pair of sides; and solder layers each formed to cover the surface of each of the metal cores other than the surface thereof which is connected to a corresponding one of the terminal electrodes.

It is preferable to respectively place the short sides of each of the metal cores on the first pair of sides.

Further, it is preferable to place the midpoints of the short sides each of the metal cores on midpoints of the first pair of sides, respectively.

In addition, it is preferable to coincide a length of the long sides of each of the metal cores with a length of the second pair of sides.

It is preferable to set a centroid of each of the metal cores on a centroid of a corresponding one of the plurality of terminal electrodes.

It is preferable to form the second metal electrode by use of titanium.

The second metal electrode preferably makes intimate contact with the first electrode.

It is preferable to set the outermost part of each of the solder layers in a short side direction of the metal cores inside a corresponding one of the plurality of terminal electrodes when the solder layers covering the metal cores are viewed from above.

Further, the terminal electrode and metal core can be formed in substantially an elliptical form. That is, another semiconductor element for the semiconductor device according to the second aspect of this invention comprises a rectangular substrate having a main surface and four sides; a plurality of substantially elliptical terminal electrodes formed on the main surface along at least one of the four sides of the substrate and each having a first minor axis parallel to the at least one side and a second major axis perpendicular to the first minor axis, each of the plurality of terminal electrodes having a laminated structure of a first metal electrode formed on the substrate and a second metal electrode formed of a material which is not wet with solder and formed on the first metal electrode; metal cores of substantially elliptic cylinder respectively formed on the plurality of terminal electrodes, the bottom surface of the metal core having a second minor axis shorter than the first minor axis of each of the plurality of terminal electrodes and a second major axis which is perpendicular to the second minor axis; and solder layers each formed to cover the surface of the metal core other than the surface thereof which is connected to the terminal electrode.

According to this invention, since the width of the solder bump in a direction in which the solder bumps are arranged adjacent to one another can be reduced, the distance between the solder bumps can be made short. As a result, the packing density can be enhanced.

In a soldering portion inspecting method for a semiconductor device having a soldering portion which includes solder covering a wiring conductor which is formed on a wiring board and whose surface portion is formed of one of gold and copper, the soldering portion inspecting method for the semiconductor device according to a third aspect of this invention comprises the steps of applying light with the wavelength of anyone of not longer than 480 nm and not shorter than 580 nm to the soldering portion on the wiring conductor; detecting reflected light from the soldering portion; and determining whether the reflected light is reflected from the surface of the wiring board or from the solder based on the intensity of the reflected light to detect whether the solder is present in the soldering portion or not.

The light is preferably monochromatic light.

Further, the wavelength of the monochromatic light is preferably set within a range from 380 nm to 480 nm or from 580 nm to 770 nm.

According to this invention, since the contrast between the reflectances of the wiring conductor material and the solder material is large, the presence of solder on the wiring conductor can be determined with high reliability. Therefore, good connection or poor connection can be determined accurately.

Further, since the inspection method permits the poor connection to be detected before the electrical inspecting method, the poor connection can be detected at an early stage and the manufacturing yield of the semiconductor device can be enhanced by repairing the poor connection. The connection inspecting method can be more safely and economically effected than the inspecting method using an X ray.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 1A and 1B are views for illustrating a semiconductor device according to a first embodiment of this invention, FIG. 1A being a plan view and FIG. 1B being a cross sectional view taken along the line 1B—1B of FIG. 1A;

FIG. 5 is a plan view of a semiconductor device according to a second embodiment of this invention;

FIG. 6 is a plan view of a semiconductor device according to a third embodiment of this invention;

FIG. 7 is a plan view of a semiconductor device according to a fourth embodiment of this invention;

FIG. 8 is a cross sectional view of a semiconductor device according to a fifth embodiment of this invention;

FIGS. 9A and 9B are diagrams for illustrating a connection inspecting method for a semiconductor device according to a sixth embodiment of this invention, FIG. 9A showing a case wherein solder is present on the wiring conductor and FIG. 9B showing a case wherein solder is not present on the wiring conductor;

FIGS. 10A and 10B are diagrams showing a modification of the connection inspecting method of the sixth embodiment, FIG. 10A showing a case wherein solder is present on the wiring conductor, FIG. 10B showing a case wherein solder is not present on the wiring conductor, and a conductive coating is formed on the wiring conductor;

FIGS. 11A and 11B are enlarged cross sectional views of a solder connecting portion of a semiconductor device according to a seventh embodiment of this invention, for illustrating the principle of the connection inspecting method;

FIG. 12 is a cross sectional view of a semiconductor device according to an eighth embodiment of this invention;

FIG. 13 is a perspective view of a semiconductor module used in the eighth embodiment;

FIG. 14 is a view for illustrating a connection inspecting method for the semiconductor device according to the eighth embodiment;

FIG. 25 is a diagram showing the wavelength dependency of the reflectance of solder.

DETAILED DESCRIPTION OF THE PREFERRED EMBODIMENTS

Figure 2:
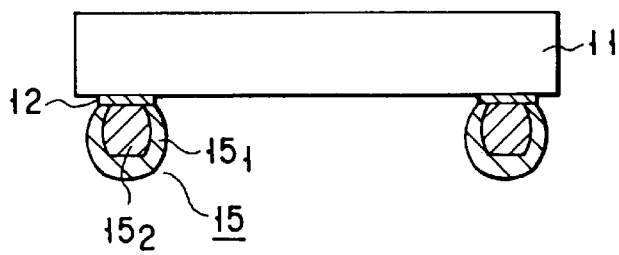
FIG. 2 is a cross sectional view of a semiconductor chip used in the first embodiment.

There will now be described embodiments of this invention with reference to the accompanying drawings.

First Embodiment

FIG. 1A is a plan view of a semiconductor device according to a first embodiment of this invention, and FIG. 1B is a cross sectional view taken along the line 1B—1B of FIG. 1A.

In FIGS. 1A and 1B, a semiconductor chip 11 is used as a semiconductor component. A plurality of terminal electrodes 12 are formed on the undersurface of the semiconductor chip 11. The semiconductor chip 11 is mounted by electrically connecting the terminal electrodes 12 to wiring conductors 14 formed on a wiring board 13 of resin via solder bumps 15.

The solder bump 15 includes a solder portion $15_1$ and a metal core $15_2$ formed of Cu or the like. Part of the solder portion $15_1$ which is formed outside the semiconductor chip 11 is formed in contact with a solder resist 17 of resin formed on the wiring conductor 14.

Soldering of the semiconductor chip 11 to the wiring board 13 is effected by the reflow method. Specifically, it is effected as follows. First, as shown in FIG. 2, the metal cores $15_2$ are formed on the respective terminal electrodes 12 of the semiconductor chip 11 and then the solder portions $15_1$ are coated on the metal cores to form the bumps 15.

After this, the bumps 15 of the semiconductor chip 11 are set in position corresponding to the respective wiring conductors 14 on the wiring board 13 and the semiconductor chip 11 is mounted on the board 13. Then, the structure is heated in a reflow furnace to melt the solder portions $15_1$ of the bumps 15 and the structure is cooled to solidify the solder portions $15_1$.

Thus, the terminal electrodes 12 and the wiring conductors 14 are electrically connected via the respective bumps 15 and the semiconductor chip 11 is mounted on the wiring board 13. At this time, the melted solder portion $15_1$ flows and spreads over the wiring conductor 14 which is wettable with solder and is interrupted by a solder resist 17. The area of contact of the bump 15 with the wiring conductor 14 can be made constant by adequately setting the amount of solder $15_1$ of the solder bump 15 and the area of a portion of the wiring conductor 14 which is not covered with the solder resist 17 (that is, the area of the pad electrode for soldering).

Further, since flow of the solder portion $15_1$ is interrupted by the solder resist 17, adjacent semiconductor chips 11 can be prevented from being connected to each other via the solder portions $15_1$ even when the adjacent bumps 15 of the adjacent semiconductor chips 11 are set close to each other, for example. If the above connection is made, the amounts of solder vary in the respective connecting portions and the reliability of connection is lowered.

As described above, a semiconductor device which attains the excellent reliability while maintaining the high packing density by the flip chip interconnection method can be provided.

In this embodiment, the solder portion $15_1$ is also formed outside the semiconductor chip 11 when viewed from above as shown in FIG. 1A. In other words, when viewing the semiconductor device from above, the solder portion $15_1$ extends out from the semiconductor chip 11.

In the generally known flip chip method, solder is not formed on the outer peripheral portion of the semiconductor chip. For this reason, it is difficult to check whether or not the terminal electrode and the wiring pattern are connected to each other. In contrast, in this embodiment, since the solder portion $15_1$ is formed to extend out from the semiconductor chip, the connection inspecting operation can be easily effected.

The length d of the protruding portion is preferably set within a range of 0.02 mm≦d≦1 mm. The reason why the range of not less than 0.02 mm is preferable is as follows.

An electrical inspecting method effected by visual observation, optical inspection or use of a probe can be considered as the above inspecting method, but in the electrical inspecting method, for example, a sensing spot to which the probe is applied is at least approx. 0.02 mm, and it becomes difficult to effect the inspecting operation if d becomes shorter than 0.02 mm. In the case of optical inspecting method, it is preferable to set d to a certain large value in order to make the inspecting operation simple. Further, it is preferable to set d longer than 0.02 mm because a relatively large area of contact of the wiring pattern 14 with the bump 15 can be attained and the connection strength can be made high.

The reason why it is preferable to set d not longer than 1 mm is as follows. If d is set to an excessively large value, the distance between the semiconductor chips cannot be reduced and it becomes difficult to attain the high packing density. Further, since the amount of solder $15_1$ flowing to the outer peripheral portion increases, the amount of solder $15_1$ used for the bump increases, thereby making it difficult to attain the high packing density which permits the bump pitch to be reduced.

By the same reason as that described above, the ratio of the length D in the lengthwise direction of the semiconductor chip to d is preferably set within a range of 0.005≦d/D≦0.25.

Further, h shown in FIG. 1B, that is, the distance between the semiconductor chip 11 and the wiring board 13 is set to approx. 0.1 mm.

Figure 3A:
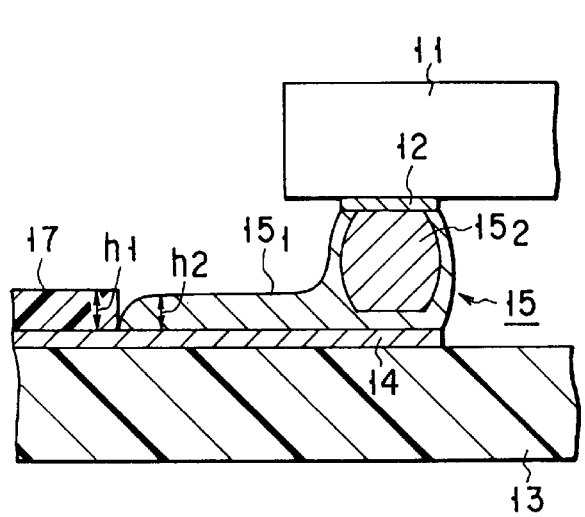
FIGS. 3A and 3B are enlarged cross sectional views of a solder connecting portion of the semiconductor device according to the first embodiment of this invention, FIG. 3A showing a case of $h_1 > h_2$ and FIG. 3B showing a case of $h_1 < h_2$.

The cross section of an enlarged portion of part of the semiconductor device shown in FIGS. 1A and 1B is shown in FIG. 3A. In FIG. 3A, $h_1$ indicates the thickness (several ten μm) of the solder resist 17 and $h_2$ indicates the thickness of the solder portion $15_1$ at the end portion interrupted by the resist. In FIG. 3A, the height of the reflowed solder portion $15_1$ at the outside of the semiconductor chip is set to $h_2$ which is smaller than $h_1$.

As is understood from FIG. 3A, when the solder portion $15_1$ adequately wets the wiring conductor 14, the front end portion of the solder portion $15_1$ interrupted by the solder resist 17 is rounded. This is a phenomenon caused by the fact that the solder resist 17 is not wet with solder and the surface tension of solder. Further, the other end portions of the solder portion $15_1$, for example, both end portions thereof in the width direction of the wiring conductor will make a curved surface by the surface tension of solder.

For example, when the optical connection inspecting method is effected, the reflection directions of the inspection light on the rounded portion of the solder portion $15_1$ and the other flat portion are different. Therefore, the reflected light from the rounded portion is not detected by the light receiving unit and the reflected light from the flat portion is detected by the light receiving unit. As a result, it becomes easy to detect the extent to which the solder portion $15_1$ has flowed.

On the other hand, if the solder portion $15_1$ does not flow out onto the wiring conductor 14 for some reason, that is, if poor connection occurs, the wiring conductor 14 is not covered with the solder portion $15_1$. The wiring pattern 14 is flat and is detected as black. Therefore, unlike the case wherein it is suitably wet, since there is no portion to be detected as white, the above two cases can be distinguished from each other based on a difference between the contrasts, thereby making it possible to easily effect the optical connection inspecting operation.

In a case where the solder portion $15_1$ flows out but does not reach the solder resist 17, it is considered that the bump 15 and the wiring conductor 14 are connected. Even in such a case, since the front end portion of the solder portion $15_1$ is rounded and detected as white, it can be distinguished from the other part.

At this time, the wavelength λ of incident light used for optical inspection is preferably set to a wavelength which permits the light to be absorbed into the solder resist 17.

As will be described later, the inspection can be made based on a difference between the reflectances of the wiring conductor 14 and the flat portion of the solder portion $15_1$.

Figure 3B:
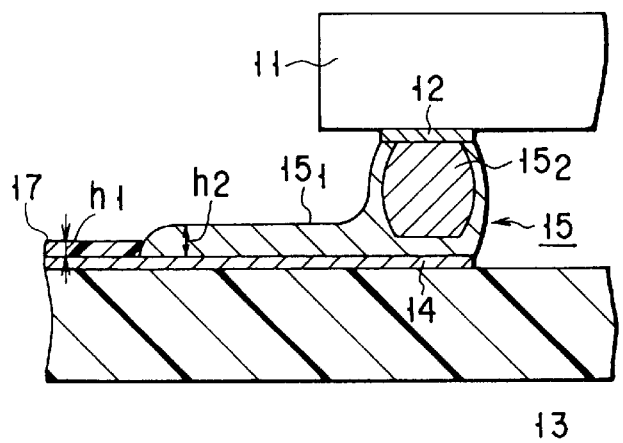

FIG. 3B shows a case of $h_1<h_2$. This is a case wherein alumina or the like is used for the wiring board 13 and chromium or the like is used for the solder resist 17. $h_1$ is set to several μm. Also, in this case, since the front end portion of the solder portion $15_1$ is rounded and detected as white, it can be distinguished from the other part. Note that in this embodiment the detector indicates the image as black, which is formed when the detector catches the reflected light, and indicates as white when no reflected light is made incident on the detector.

Figure 4A:
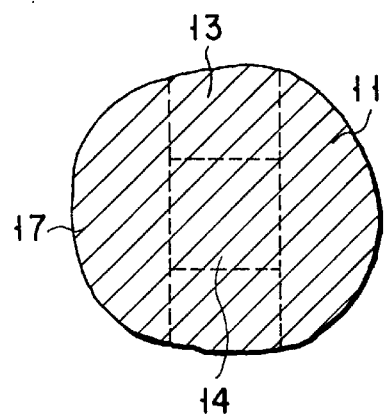
FIGS. 4A and 4B are views showing an image on a light receiving unit in the optical connection inspecting method, FIG. 4A showing a case wherein solder is not present on the wiring conductor, FIG. 4B showing a case wherein solder is present on the wiring conductor.
Figure 4B:
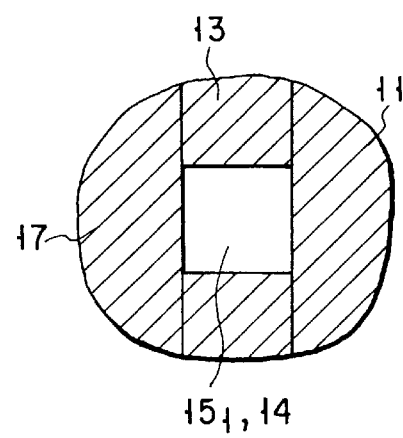

As described before, the front end or contour of the outflowing solder $15_1$ can be detected by use of the reflection of light, but if most part of the solder portion $15_1$ has a curved surface, the portion is detected as white so that more reliable inspection can be effected. The condition for setting up such a state is that the relation between the distance d from the outer periphery of the semiconductor chip 11 to the solder resist 17 and the width W (shown in FIG. 1) of the wiring conductor 14 is set to W≧d. FIGS. 4A and 4B show the images on the detector in such a case.

More specifically, when poor connection is made between the semiconductor chip 11 and the wiring conductor 14, the solder $15_1$ of the bump 15 does not wet the wiring conductor 14. FIG. 4A shows an image on a detector (for example, CCD sensor) obtained when light (for example, LED, laser) is applied from above. The hatched portion indicates that the light is reflected and detected by the detector. In this case, most part of the incident light applied from above is reflected and made incident on the detector since the entire portion of the reflection surface is flat.

If the solder $15_1$ flows out onto the wiring conductor 14, part of the solder $15_1$ has a curved surface and the incident light is scattered and is not received by the detector. Therefore, as shown in FIG. 4B, part of the wiring conductor 14 (solder $15_1$) is detected as white. As a result, the flowout of solder can be detected with high contrast.

Second Embodiment

FIG. 5 is a plan view of a semiconductor device according to a second embodiment of this invention. In FIG. 5, potions which are the same as those of FIG. 1 are denoted by the same reference numerals. This is also applied to the following embodiments.

The semiconductor device of FIG. 5 is different from the semiconductor device of FIG. 1 in that openings 18 are formed in the solder resist 17 and part of the solder resist 17 is also present between the adjacent solder portions $15_1$.

Because of the presence of the solder resist 17 between the adjacent solder portions, the adjacent solder portions $15_1$ can be prevented from being bridged and short-circuited at the time of reflow.

Third Embodiment

FIG. 6 is a plan view of a semiconductor device according to a third embodiment of this invention.

The semiconductor device of FIG. 6 is different from the semiconductor device of FIG. 5 in that the width of each of the openings 18 is reduced and the area thereof is reduced.

Since the area of the opening 18 is small, that is, the area of the wiring conductor 14 exposed to the opening 18 is small, the amount of the solder $15_1$ can be reduced in comparison with the case of the semiconductor device of FIG. 2. That is, the size of the bump 15 before reflow can be reduced and the packing density can be enhanced.

Fourth Embodiment

FIG. 7 is a plan view of a semiconductor device according to a fourth embodiment of this invention.

The semiconductor device of FIG. 7 is different from the semiconductor device of FIG. 5 in that the positions of the wiring conductors 14 are partially deviated from the respective openings 18.

With the above structure, the area of the wiring conductor 14 exposed to the opening 18 is reduced. Therefore, the amount of the solder $15_1$ can be reduced like the case of the semiconductor device of FIG. 6 and the size of the bump 15 before the reflow can be reduced.

Fifth Embodiment

FIG. 8 is a plan view of a semiconductor device according to a fifth embodiment of this invention.

The semiconductor device of FIG. 8 is different from the semiconductor device of FIG. 1 in that a spacer 19 is disposed between the semiconductor chip 11 and the wiring board 13 and the metal core $15_2$ is not formed in the bump 15.

Since the spacer 19 is provided, the distance between the semiconductor chip 11 and the wiring board 13 can be set not smaller than the height $h_s$ of the spacer 19 at the time of reflow of the solder $15_1$ even if the metal core is not provided.

Sixth Embodiment

FIGS. 9A, 9B, 10A, 10B show an optical connection inspecting method for a semiconductor device according to this invention which is different from that described in the first embodiment.

As shown in FIGS. 9A, 9B, light 21 emitted from a light source 20 (for example, LED, laser) is reflected from the solder portion $15_1$ and is made incident on a light receiving unit 22 (for example, CCD sensor) (FIG. 9A) in a state after reflow of the solder $15_1$. In a state before reflow of the solder $15_1$, the light is reflected from the wiring board 14 and enters the light receiving unit 22 (FIG. 9B).

Generally, the surface roughness of the wiring board 14 is 100 nm or more, but the surface roughness of the solder portion $15_1$ is 20 nm or less to provide a mirror-like surface, and therefore, they can be distinguished from each other based on a difference in the reflectance. Thus, the connection inspection for the solder $15_1$ can be easily effected.

FIGS. 10A, 10B show a case wherein a conductive member 23 is coated on the wiring conductor 14. In this case, as shown in FIG. 10B, the light 21 is reflected from the member 23 in a state before the reflow. Also, in this case, the connection inspection can be easily effected based on a difference in the reflectance between the solder $15_1$ and the member 23.

Seventh Embodiment

FIGS. 11A, 11B are cross sectional views of a semiconductor device according to a seventh embodiment of this invention.

The semiconductor device is different from the semiconductor device of FIG. 1 in that the front end portion of the solder resist 17 is obliquely cut.

With the above structure, when the optical inspection is effected, the light 21 reflected from the end portion of the solder resist 17 does not enter the light receiving unit 22 even if the solder resist 17 is formed of a material which reflects the incident light 21. Therefore, the contrast of the reflected lights from the solder resist 17 and the wiring board 14 becomes high and the boundary between the solder resist 17 and the wiring board 14 can be clearly determined and the inspection can be made easy.

Eighth Embodiment

FIG. 12 is a cross sectional view of a semiconductor device according to an eighth embodiment of this invention. This embodiment uses a semiconductor module 31 having a semiconductor chip and a circuit integrally formed therein as a semiconductor component. FIG. 13 is a perspective view showing the semiconductor module 31 as viewed from below.

In the semiconductor module 31, a semiconductor chip 11 and passive components 39 are disposed on a module substrate 38, they are connected via wiring conductors 14, and a portion having the semiconductor chip mounted thereon is covered with a cap 40. Terminal electrodes 32 are formed on the opposite surface of the module substrate 38 and the semiconductor chip 11 and passive components 39 are connected to the terminal electrodes 32 through via-conductors 41 formed to penetrate the module substrate 38. The terminal electrodes 32 are connected to electrodes 34 (corresponding to the wiring conductors 14 in FIG. 1) on the wiring board 33 via bumps formed of solder 35. Further, solder resists 37 are formed in position adjacent to the electrodes 34 on the wiring board 33.

The semiconductor device is different from the semiconductor device of FIG. 1 in that the solder resist 37 is not formed on the wiring conductor but is formed directly on the board 33, but substantially the same effect as in the case of FIG. 1 can be attained.

The case of optical inspection can be effected by use of the same method as that used in the embodiment in which the semiconductor chip is used as the semiconductor component, but the inspection can be effected by applying the light 21 to a fillet portion of the bump 35 directly from above as shown in FIG. 14 and reflecting the light towards the light receiving unit 22.

Figure 15:
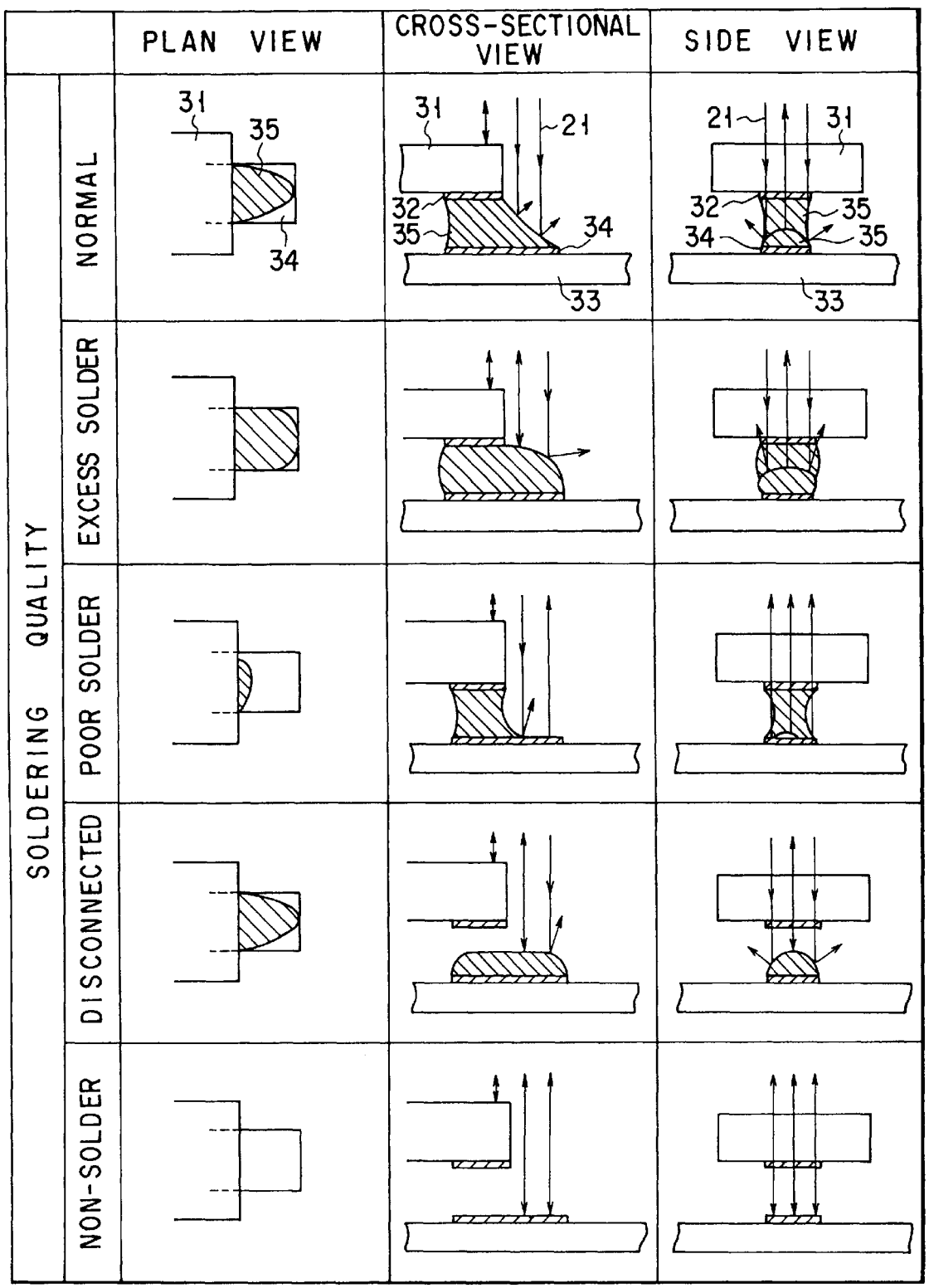
FIG. 15 is a diagram showing the relation between various solder connecting configurations and the reflection directions of the inspecting light.

A case wherein connection of the solder 15 is normal and cases of excess solder, poor solder, disconnected state and non-solder are shown for comparison in FIG. 15. Since the way the light 21 is reflected is different between the normal case and the other cases, the connection inspection can be easily effected by adequately placing light receiving units 22 according to the specifications.

Figure 16:
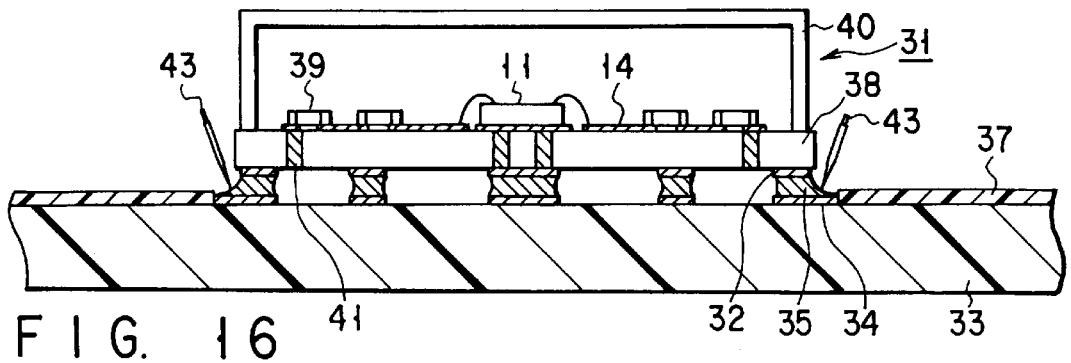
FIG. 16 is a view for illustrating another connection inspecting method for the semiconductor device according to the eighth embodiment.

Further, the connection inspection can be effected by the electrical inspection effected by applying a probe. The state of inspection is shown in FIG. 16. The connection inspection is effected by applying a probe 43 to a solder portion 35. Since the solder portion 35 extends outwardly, the inspection can be easily effected.

Ninth Embodiment

Figure 17:
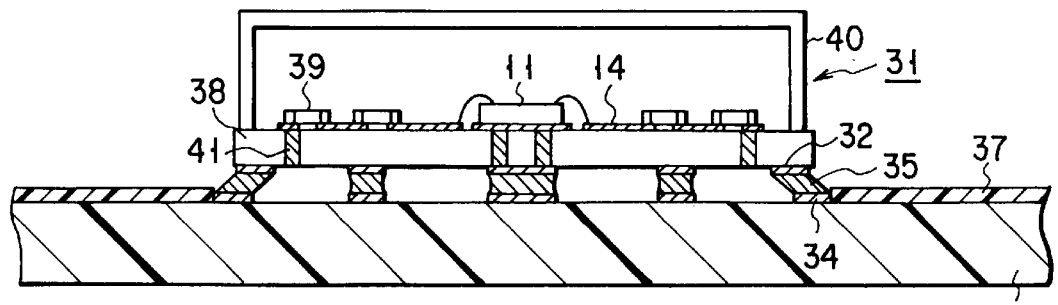
FIG. 17 is a cross sectional view of a semiconductor device according to a ninth embodiment of this invention.

FIG. 17 is a cross sectional view of a semiconductor device according to a ninth embodiment of this invention.

The semiconductor device is different from the semiconductor device of FIG. 14 in that the electrodes 34 lying near the outer peripheral portion of the semiconductor module 31 are formed in position outwardly deviated from directly under the corresponding terminal electrodes 32. In this case, since the electrode 34 can be made smaller than in the case of FIG. 14, the amount of solder 34 can be reduced. As a result, the distance between the electrodes 32 and 34 can be reduced.

Tenth Embodiment

Figure 18:
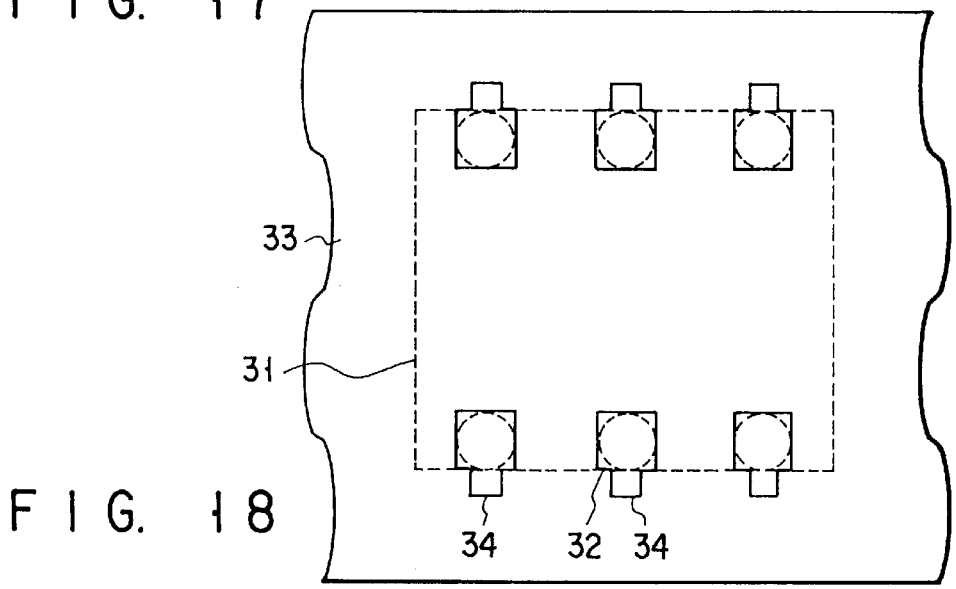
FIG. 18 is a plan view of a semiconductor device according to a tenth embodiment of this invention.

FIG. 18 is a cross sectional view of a semiconductor device according to a tenth embodiment of this invention.

In the above semiconductor device, a portion of the electrode 34 which extends out from the outer peripheral portion of the semiconductor module 31 is made smaller than a portion thereof which is formed inside the outer peripheral portion. With this structure, the amount of solder 35 can be reduced and the same effect as those of FIGS. 6, 7 can be attained.

Eleventh Embodiment

Figure 19:
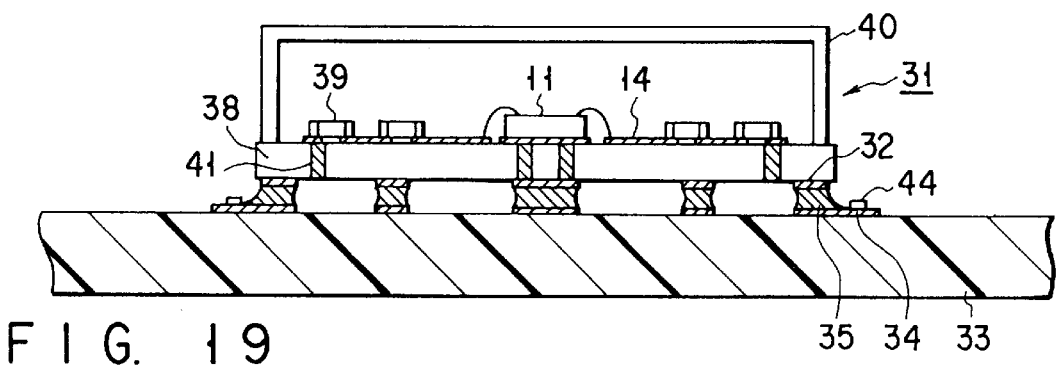
FIG. 19 is a cross sectional view of a semiconductor device according to a eleventh embodiment of this invention.

FIG. 19 is a cross sectional view of a semiconductor device according to an eleventh embodiment of this invention.

The semiconductor device is different from the semiconductor device of FIG. 11 in that solder resists 44 are formed on the electrodes 34. With this structure, the same effect as the semiconductor device of FIG. 1 can be attained.

In the above embodiments, the semiconductor chip or semiconductor module is used as the semiconductor component, but a packaged semiconductor chip with bump terminals containing only a semiconductor chip can be used.

Further, titanium or nickel can be used for the solder resist. Any material can be used if the material is difficult to be wet with solder and if it can be used to interrupt solder.

Twelfth Embodiment

Figure 20A:
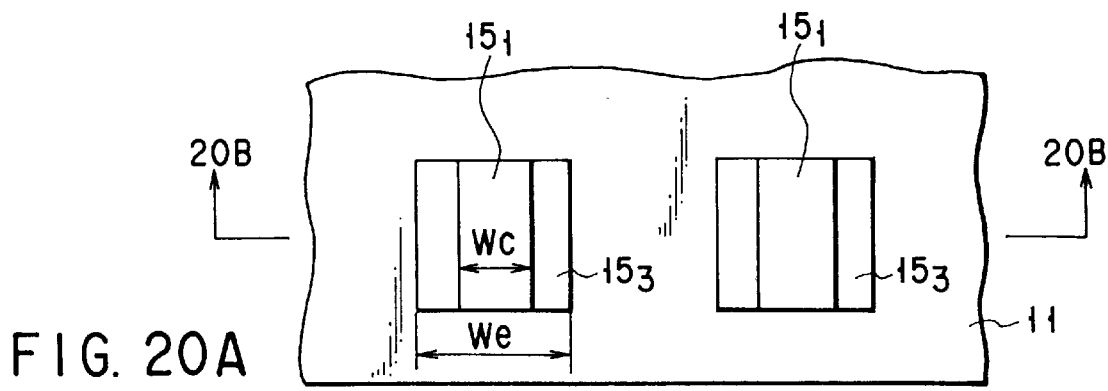
FIGS. 20A and 20B are views for illustrating the solder bump structure of a semiconductor device according to a twelfth embodiment of this invention, FIG. 20A being a plan view of a semiconductor chip and FIG. 20B being a cross sectional view taken along the line 20B—20B of FIG. 20A.
Figure 20B:
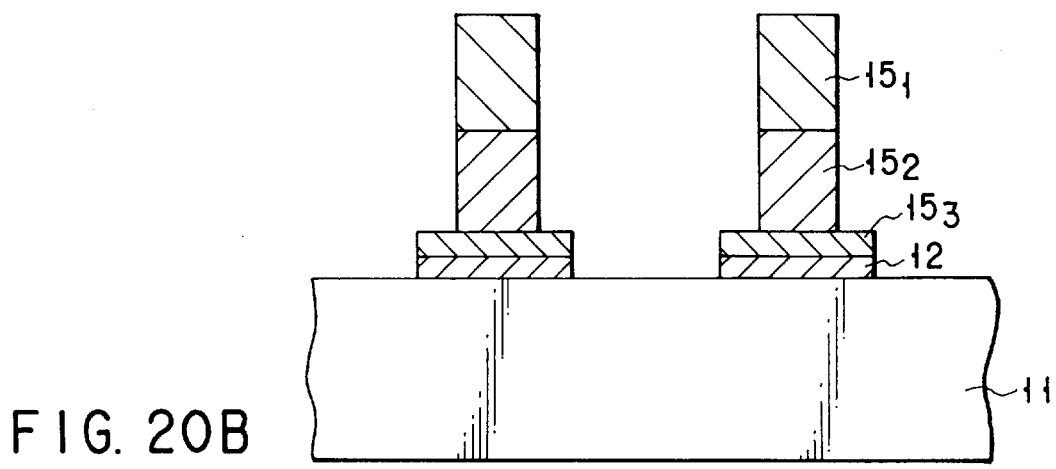
Figure 21:
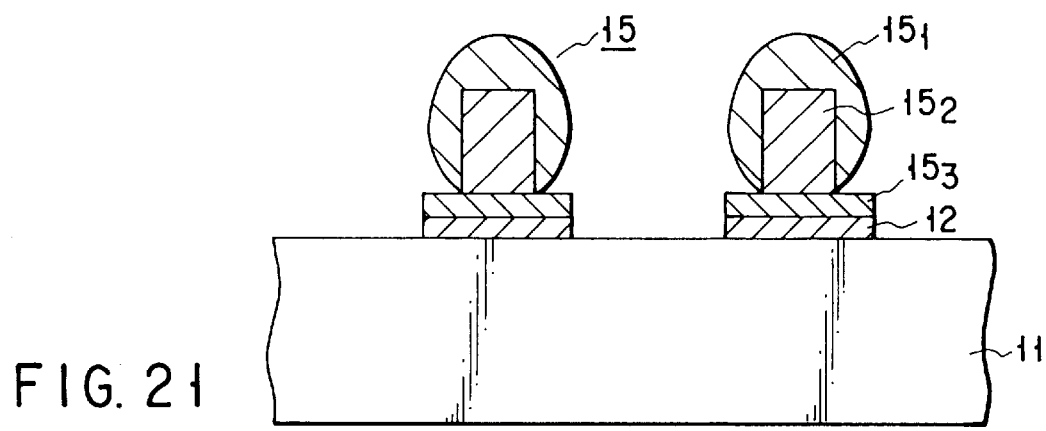
FIG. 21 is a cross sectional view of a semiconductor chip showing the state set after reflow of the solder bump shown in FIG. 20B.

The embodiment relates to the structure of the solder bumps 15 formed on the semiconductor chip 11. FIG. 20A is a plan view showing the solder bumps 15 which are formed on the peripheral portion of the semiconductor chip 11 in the course of the manufacturing process and FIG. 20B is a cross sectional view taken along the line 20B—20B of FIG. 20A. FIG. 21 is a cross sectional view showing a state in which the solder bumps 15 are formed by heating the semiconductor chip 11 of FIG. 20B to reflow the solder portions $15_1$. FIGS. 20A, 20B, 21 show the bump forming surface set faceup unlike the case of FIG. 2.

One of the features of this embodiment is that barrier metal $15_3$ (for example, Ti) which is difficult to be wet with solder is inserted between the electrode 12 of the semiconductor chip 11 and the metal core $15_2$ (for example, Cu) of the solder bump 15.

Further, another feature of this embodiment is that the relation between the width Wc of the metal core $15_2$ formed on the barrier metal $15_3$ in a direction parallel to the edge of the semiconductor chip and the width We of the barrier metal $15_3$ in the same direction is set such that We>Wc. Since the electrode 12 and the barrier metal $15_3$ are normally formed in a square form, the plane shape of the metal core $15_2$ is made in a rectangular form.

With the above structure, since the solder $15_1$ does not wet the barrier metal $15_3$ at the time of reflow, it is deformed into an egg-shaped cross section as shown in FIG. 21 with the metal core $15_2$ used as a core and then solidified. That is, the solder bump 15 is formed in a slim form in a direction parallel to the edge of the semiconductor chip 11. Therefore, it becomes difficult for the adjacent solder bumps 15 to be formed in contact with each other and it becomes possible to reduce the distance between the solder bumps 15.

Figure 22:
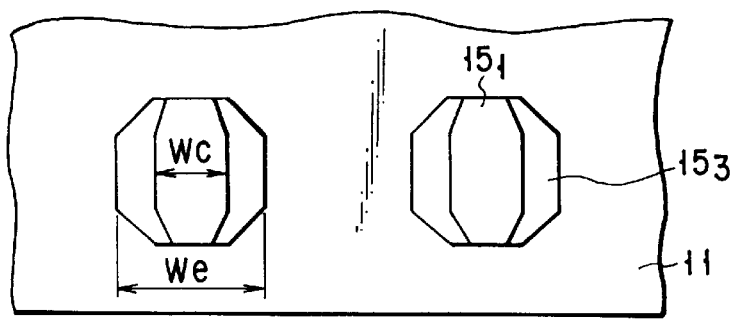
FIG. 22 is a plan view for illustrating a modification of the solder bump structure of the twelfth embodiment.
Figure 23:
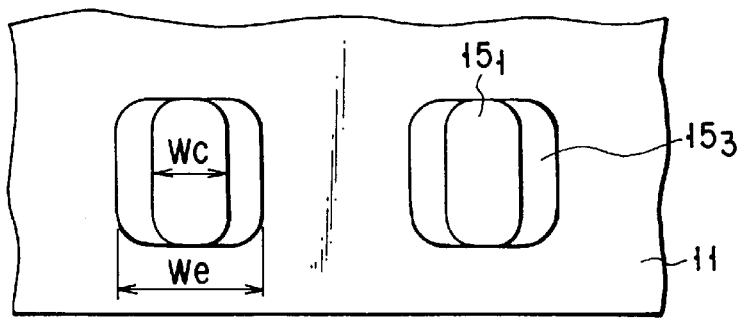
FIG. 23 is a plan view for illustrating another modification of the solder bump structure of the twelfth embodiment.

In the above embodiment, the plane shapes of the terminal electrode and the metal core are formed in a square form or rectangular form, but the shape is not limitative and may be octagonal as shown in FIG. 22 or substantially elliptical (circular) as shown in FIG. 23.

Thirteenth Embodiment

This embodiment relates to an inspection method for solder connection. The measurement system is the same as that of FIG. 11A, and specifically, the connection state is inspected by applying light of selected wavelength from the light source 20 to the solder $15_1$ on the wiring conductor 14, detecting the reflected light by the detector 22 and determining the presence or absence of solder based on the contrast of the reflectance.

The connection inspecting method of this invention is explained by taking the semiconductor device shown in FIGS. 1A, 1B as an example. As described before, in the semiconductor device of this invention, the wiring conductors 14 are arranged outside the semiconductor element 11. The material of the wiring conductor is not specifically limited if the surface of the conductor is covered with gold or copper. As the wiring board 13, a laminated glass epoxy board, polyimide flexible board or the like can be used. In this embodiment, gold is used for the surface portion of the wiring board and a laminated glass epoxy board is used as the material of the wiring board.

Before explaining the inspection method, a method for manufacturing the semiconductor device used for inspection is explained.

First, a semiconductor chip 11 which is the same as that of FIG. 2 is prepared. For the metal core $15_2$ of the solder bump 15 on the semiconductor chip 11, copper, nickel, tungsten or solder having a higher melting point than the solder $15_1$ can be used. The bump 15 has the solder $15_1$ deposited on the metal core $15_2$ by the electroplating method. The size of the semiconductor element 11 and the number of bumps can be freely set.

The semiconductor chip 11 is set to correspond in position to the pad electrode (wiring conductor) 14 on the wiring board 13 by use of a flip chip bonder and the bumps 15 are electrically and mechanically set in contact with the pad electrodes 14 of the wiring board 13. At this time, the wiring board 13 is held on a heating stage and is heated to 200° C. or more in the nitrogen atmosphere.

Further, a collet for holding the semiconductor chip 11 is heated to 200° C. in the nitrogen atmosphere to melt the solder and temporarily connect the semiconductor chip 11 and the wiring board 13 to each other with the bumps 15 of the semiconductor chip 11 set in contact with the pad electrodes 14 of the wiring board 13.

Finally, the semiconductor chip 11 and the wiring board 13 are completely connected to each other by passing the wiring board 13 having the semiconductor chip 11 mounted thereon into the reflow furnace which is heated to 250° C. in the nitrogen atmosphere. By effecting the above process, a semiconductor device having the semiconductor chip 11 connected to the wiring board 13 by the flip chip connection as shown in FIGS. 1A, 1B can be attained.

Next, the connection inspection method of this invention is explained. As shown in FIG. 11, light of selected wavelength is applied from the light source 20 to the solder connecting portion and the reflected light is detected by the detector 22. Further, the presence or absence of solder is determined based on a difference in the contrast of the reflectance and thus the connection state is inspected.

As the light source, a deuterium discharge lamp, hollow cathode lamp, xenon lamp, tungsten lamp or the like can be used. Further, it is preferable to change the light emitted from the light source to monochromatic light by use of a spectroscope. As the spectroscope, a prism and diffraction grating can be used. Further, as the light source, a He—Ne laser, Ar laser, ruby laser, or AlGaAs laser can be used. In this embodiment, the hollow cathode lamp is used as the light source 20 and the type of the element of the cathode is set to K. In this case, the wavelength of the emitted light is 760 nm.

Figure 24:
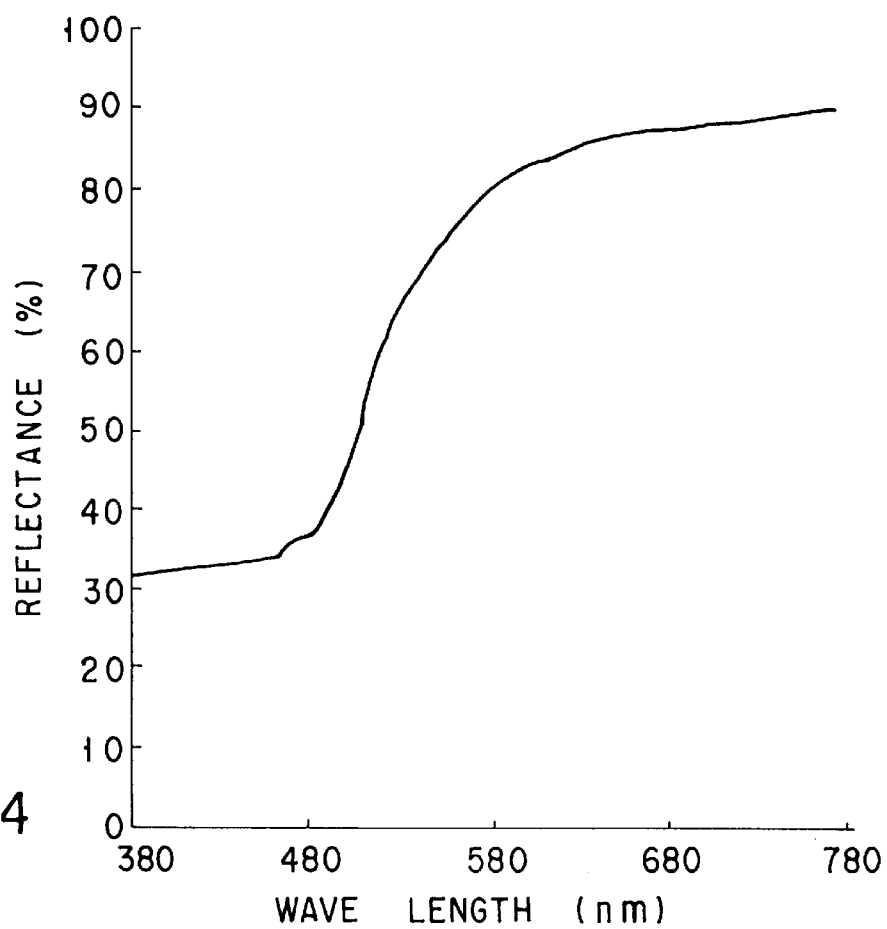
FIG. 24 is a diagram showing the wavelength dependency of the reflectance of gold formed on the surface of the wiring conductor.

FIG. 24 is a diagram showing the wavelength dependency of the light reflectance in a case where the surface portion of the wiring board is formed of gold. The ordinate indicates the relative reflectance obtained based on the assumption that the reflectance is 100% when a standard white surface is used and the reflectance is set to 0 to 3% when a black surface is used. The reflectance is set to 30 to 40% in a range of 480 nm or less, it rapidly increases in a range of 480 to 580 nm, and it reaches as high as approx. 90% in a range of 580 nm or more. Also, it is confirmed that the same characteristic can be attained when the surface portion of the wiring conductor is formed of copper.

FIG. 25 shows the wavelength dependency of the reflectance when light is applied to solder. In the case of solder, the reflectance is kept substantially unchanged and kept at approx. 50% in a range of 480 to 770 nm.

The reflectance of light also depends on the surface condition of the solder and the material of the wiring conductor. However, since the wavelength dependency of the reflectance is not changed, the contrast of the reflectance can be obtained more clearly when the wavelength of light used for inspection is selected than when the wavelength of light used for inspection is not selected. Therefore, the contrast of the reflectance can be made higher by selecting the wavelength of light used for inspection and the state of the connecting portion can be more accurately determined.

When light of the wavelength of 580 nm or more is used as in this embodiment, the reflectance smaller than the reflectance of the wiring conductor material will be detected since solder covers the wiring conductor if the connection is correctly made. On the other hand, if the solder bump 15 and the wiring conductor 14 are deviated from each other and are not made in contact with each other because the solder bump is small, for example, no solder flows onto the wiring conductor 14, and as a result, the reflectance of the wiring conductor material is detected as the reflectance of light. Therefore, the clear contrast of the reflectance can be attained based on the presence or absence of solder on the wiring conductor.

When light of the wavelength of 480 nm or less is used, the reflectance larger than the reflectance of the wiring conductor material will be detected since solder covers the wiring conductor if the connection is correctly made. On the other hand, if poor connection is made, no solder flows onto the wiring conductor 14, and as a result, the reflectance of the wiring conductor material is detected as the reflectance of light. Therefore, the clear contrast of the reflectance can be attained based on the presence or absence of solder on the wiring conductor.

As described above, since the contrast of the reflectance is increased by adequately selecting the wavelength of light to be applied, the presence or absence of solder on the wiring conductor can be correctly determined. Therefore, it becomes possible to correctly determine whether or not the semiconductor chip and the wiring board are correctly connected to each other or not. Further, in order to visually effect the optical inspection, it is preferable to use visible light (whose wavelength ranges from 380 nm to 770 nm) as inspection light which is monochromatic light.

Further, since the poor connection can be detected before effecting the electrical inspection for the semiconductor device according to the above inspection method, the manufacturing cost can be lowered. Further, the inspection for connection can be more safely and economically effected in the above inspection method than in the inspection method using X ray.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor element for a semiconductor device comprising:
   a rectangular substrate having a main surface and four sides;
   a plurality of rectangular terminal electrodes formed on the main surface adjacent to at least one of the four sides of said substrate, each of the terminal electrodes having a first pair of sides parallel to said at least one side of the substrate and a second pair of sides perpendicular to the first pair of sides and each of said terminal electrodes further having a laminated structure comprising,
   a first metal electrode formed on said substrate, and
   a second metal electrode formed on said first metal electrode with a material which is not wettable with solder;
   a plurality of rectangular parallelpiped metal cores, each metal core being respectively formed on said plurality of terminal electrodes, a bottom surface of each of said metal cores having short sides shorter than the first pair of sides of each of said plurality of terminal electrodes and long sides which are perpendicular to the short sides and are not longer than the second pair of terminal sides; and
   a plurality of solder layers, each solder layer respectively covering the surface of each of said metal cores other than the surface thereof which is connected to a corresponding one of said terminal electrodes.

2. The semiconductor element according to claim 1, wherein the short sides of each of said metal cores are placed on the first pair of sides.

3. The semiconductor element according to claim 2, wherein midpoints of the short sides of each of said metal cores are placed on midpoints of the first pair of sides, respectively.

4. The semiconductor element according to claim 1, wherein a length of the long sides of each of said metal cores coincide with a length of the second pair of sides.

5. The semiconductor element according to claim 1, wherein a centroid of each of said metal cores is set on a centroid of a corresponding one of said plurality of terminal electrodes.

6. The semiconductor device according to claim 1, wherein said second metal electrode is formed of titanium.

7. The semiconductor element according to claim 1, wherein the outermost part of each of said solder layers in a short side direction of said metal cores is set inside a corresponding one of said plurality of terminal electrodes when said solder layers covering said metal cores are viewed from above.

8. A semiconductor element for a semiconductor device comprising:

- a rectangular substrate having a main surface and four sides;
- a plurality of substantially elliptical terminal electrodes formed on the main surface adjacent to at least one of the four sides of said substrate, each of the terminal electrodes having a first minor axis parallel to said at least one side and a second major axis perpendicular to the first minor axis and each of said terminal electrodes further having a laminated structure comprising,
    - a first metal electrode formed on said substrate, and
    - a second metal electrode formed on said first metal electrode with a material which is not wettable with solder;
- a plurality of metal cores of substantially elliptical shape, each metal core being respectively formed on said plurality of terminal electrodes, the bottom surface of each said metal core having a second minor axis shorter than the first minor axis of each of said plurality of terminal electrodes and a second major axis which is perpendicular to the second minor axis; and
- a plurality of solder layers, each solder layer respectively covering the surface of each said metal core other than the surface thereof which is connected to a corresponding one of said terminal electrodes.

* * * * *